(12) United States Patent
Jain

(10) Patent No.: US 6,417,689 B1
(45) Date of Patent: Jul. 9, 2002

(54) METHOD AND APPARATUS FOR PLACING OUTPUT SIGNALS HAVING DIFFERENT VOLTAGE LEVELS ON OUTPUT PINS OF A PROGRAMMABLE LOGIC DEVICE

(75) Inventor: Gitu Jain, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/766,317

(22) Filed: Jan. 16, 2001

(51) Int. Cl.⁷ .................................. G06F 7/38
(52) U.S. Cl. ........................... 326/38; 326/41
(58) Field of Search ............... 376/38, 39, 41

(56) References Cited

U.S. PATENT DOCUMENTS

| 5,563,528 A | 10/1996 | Diba et al. | |
| 6,057,705 A | * 5/2000 | Wojewoda et al. | 326/38 |
| 6,130,550 A | * 10/2000 | Zaliznyak et al. | 326/39 |

OTHER PUBLICATIONS

US 6,300,790, 10/2001, Veenstra et al. (withdrawn)*

* cited by examiner

Primary Examiner—Michael Tokar
Assistant Examiner—Anh Q. Tran
(74) Attorney, Agent, or Firm—LeRoy D. Maunu

(57) ABSTRACT

A method and apparatus for placing output signals having different voltage levels on output pins of a programmable logic device (PLD). The PLD includes a plurality of function blocks (FBs), and each FB includes one or more output pins. The output signals are organized into logical output banks (LOBs), the output signals in each LOB having a common voltage level. Each of the FBs is associated with an LOB. For each FB, one or more unplaced signals are selected for placement in the FB as a function of a number of unplaced output signals in the LOB with which the FB is associated ("current LOB"), a number of output pins in FBs associated with LOBs other than the current LOB, and a number of output pins in all FBs that are associated with the current LOB and that have no assigned output signals.

16 Claims, 8 Drawing Sheets

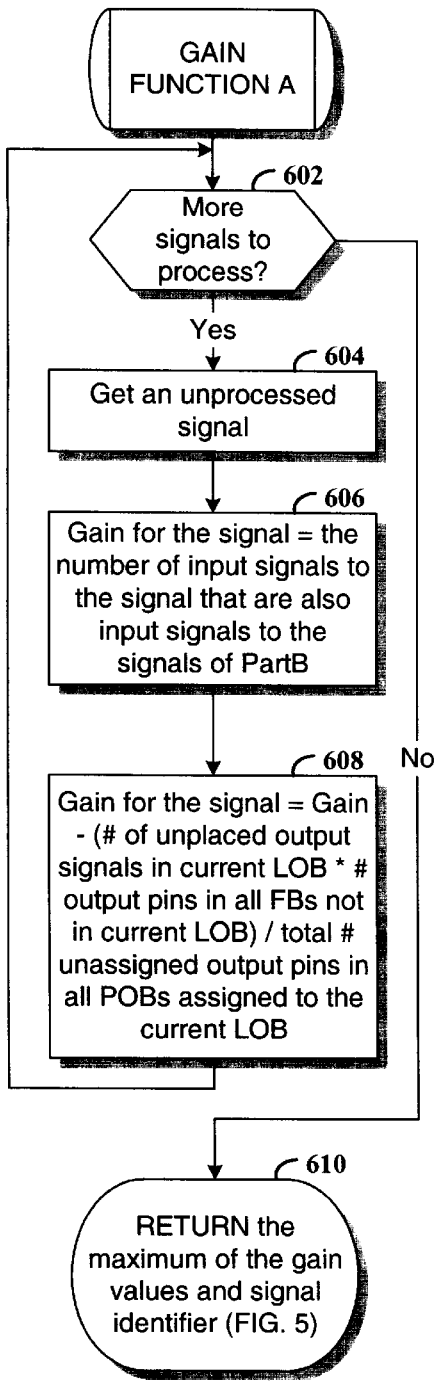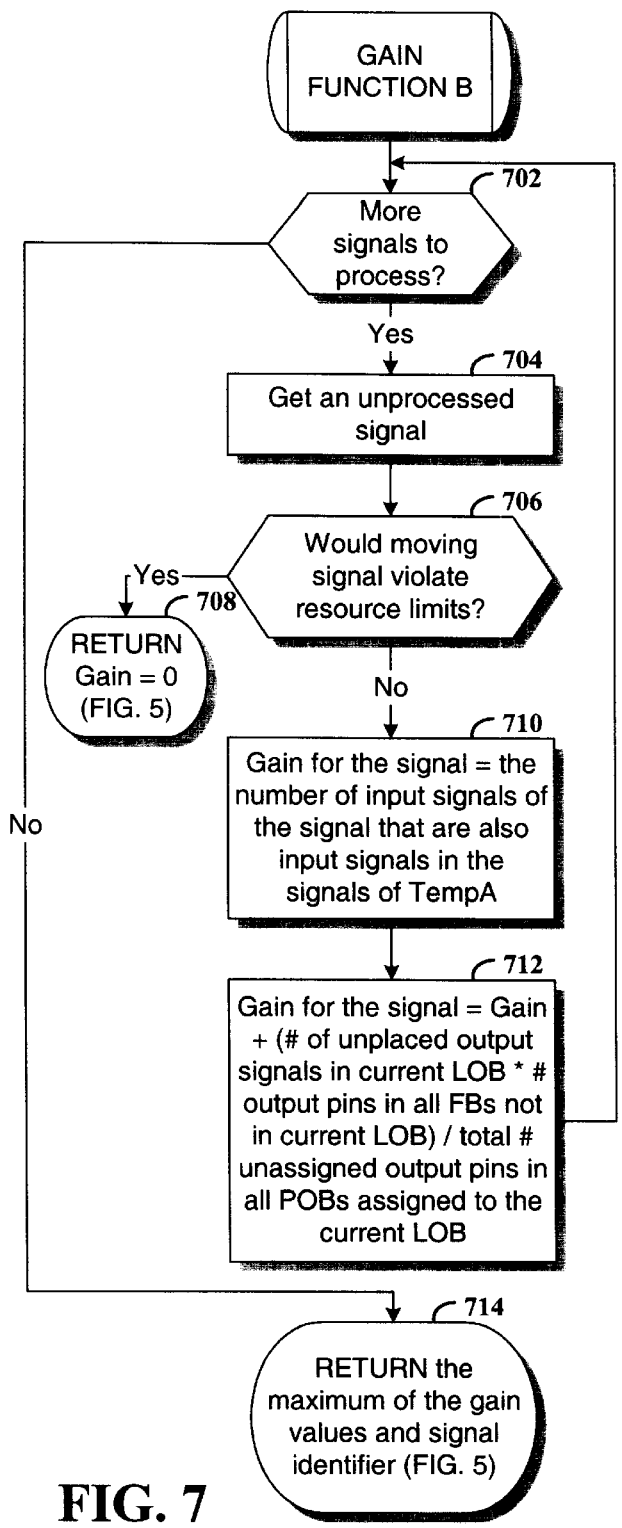
FIG. 6
FIG. 7

US 6,417,689 B1

METHOD AND APPARATUS FOR PLACING OUTPUT SIGNALS HAVING DIFFERENT VOLTAGE LEVELS ON OUTPUT PINS OF A PROGRAMMABLE LOGIC DEVICE

FIELD OF THE INVENTION

The present invention generally relates to placing output signals of a circuit design on output pins of a device, and more particularly to placing output signals having different voltage levels.

BACKGROUND

Example complex programmable logic devices (CPLD) are found in the XC9500 family of CPLDs from Xilinx. The XC9500 CPLDs include input/output blocks (IOBs), function blocks (FBs), and a switch matrix for interconnecting the function blocks and I/O blocks. Such a switch matrix is described in U.S. Pat. No. 5,563,528, entitled, Multiplexer for Programmable Logic Device, to Diba et al. The inputs to the switch matrix are input pins from the IOBs and feed-backs from the FBs.

The semiconductor industry standard operating voltage has in the past been 5 volts, and all devices on a system board have operated at 5 volts. The IOBs were designed to interface with structures outside the chip using 5 volts as a power supply voltage. However, the industry is presently migrating to lower voltages for faster operation at lower power. Rather than all chips in a system operating at a single voltage, different chips operating at different power supply voltages may be present in a single system. It may be desirable for a CPLD in a mixed-voltage system to interface with chips operating at different voltage levels.

Some devices in the XC9500 family of CPLDs have multiple output banks, also referenced as "physical output banks" (POBs). An output bank includes a set of output pins that are driven by the same output power supply (VCCIO). All the pins of a function block belong to the same physical output bank and are all driven by the same VCCIO. Each physical output bank is programmable to a selected VCCIO. By setting the VCCIO of certain physical output banks to the same voltage level, the banks can be viewed as merged into one "logical output bank" (LOB).

As with any programmable logic device, a CPLD has a limited number of pin resources. Thus, for most any design, a placement solution that makes efficient use of pin resources while satisfying the output banking requirements is desirable. A method and apparatus that addresses aforementioned problems, as well as other related problems, are therefore desirable.

SUMMARY OF THE INVENTION

In various embodiments, a method and apparatus are provided for placing output signals having different voltage levels on output pins of a programmable logic device (PLD). The PLD includes a plurality of function blocks (FBs), and each FB includes one or more output pins. The output signals are organized into logical output banks (LOBs), the output signals in each LOB having a common voltage level. Each of the FBs is associated with an LOB. For each FB, one or more unplaced signals are selected for placement in the FB as a function of a number of unplaced output signals in the LOB with which the FB is associated ("current LOB"), a number of output pins in FBs associated with LOBs other than the current LOB, and a number of output pins in all FBs that are associated with the current LOB and that have no assigned output signals.

It will be appreciated that various other embodiments are set forth in the Detailed Description and Claims, which follow.

BRIEF DESCRIPTION OF THE DRAWINGS

Various aspects and advantages of the invention will become apparent upon review of the following detailed description and upon reference to the drawings in which:

FIG. 6 is a flowchart of a process for finding the maximum gain value for the signals assigned to a particular FB;

FIG. 7 is a flowchart of a process for finding the maximum gain value for the unplaced signals;

DETAILED DESCRIPTION

Various embodiments of the present invention are described as applied to a particular CPLD from Xilinx, Inc. While the invention is not limited in scope to the particular example CPLD, the various embodiments will be presented in terms of elements from the CPLD. Those skilled in the art will appreciate that the invention could be applied to PLDs other than the example CPLD.

Figure 1:
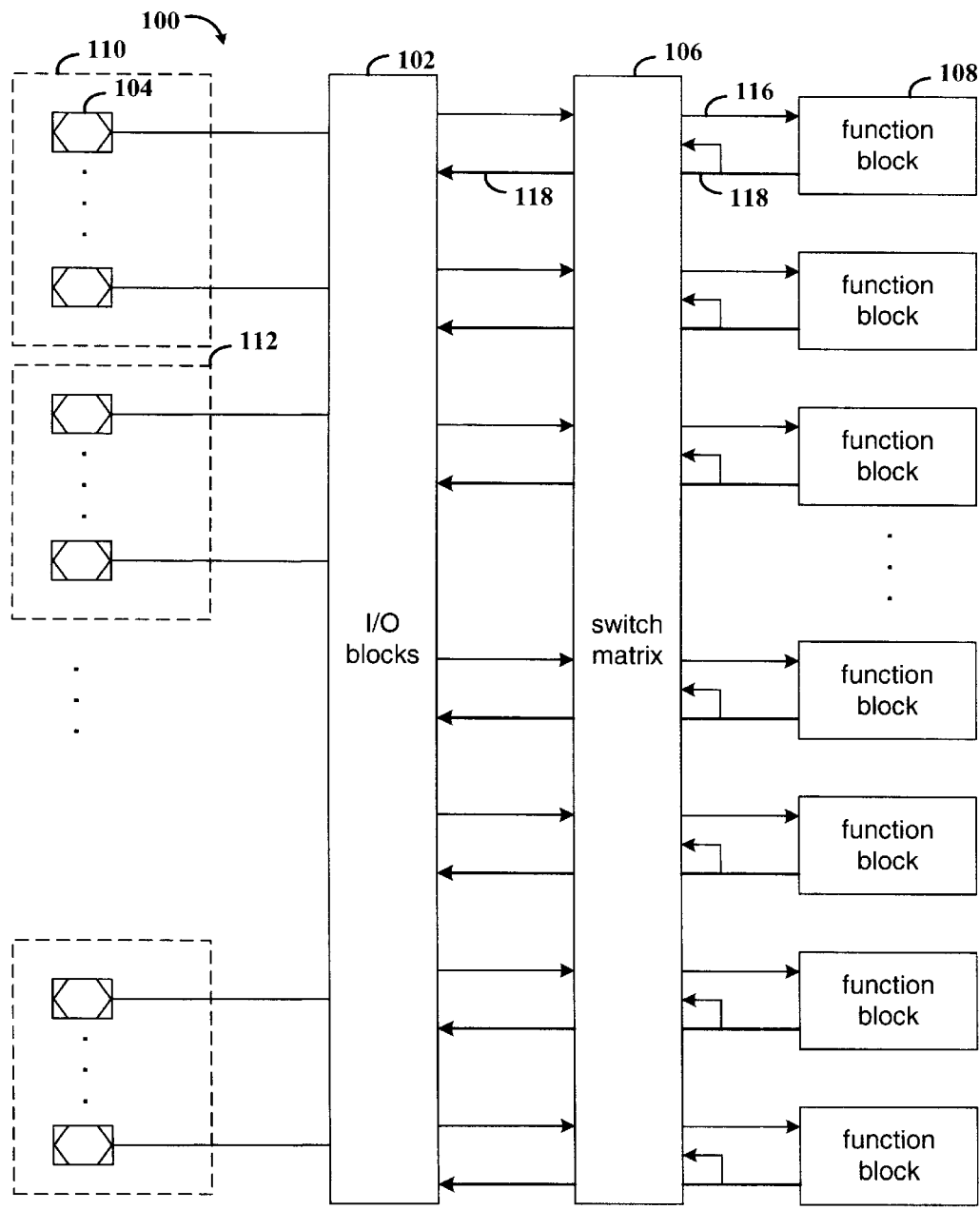
FIG. 1 is a functional block diagram of an example CPLD to which the present invention may be applied in placing output signals of a design.

FIG. 1 is a functional block diagram of an example CPLD to which the present invention may be applied in placing output signals of a design. It will be appreciated that the embodiments of the invention described below are not limited to example CPLD 100. Designs to be implemented on different CPLD architectures could be placed in accordance with the present invention.

CPLD 100 includes multiple function blocks, for example function block 108, and multiple I/O blocks 102. The function blocks are fully interconnected by switch matrix 106. Each function block directly drives a subset of the I/O blocks. The I/O blocks are connected to input/output pins, for example one of I/O blocks 102 is connected to pin 104. Each function block provides programmable logic capability, and each I/O block provides buffering for device inputs and outputs. For each function block, some output ports and associated output enable signals drive directly to the I/O blocks, as shown by line 118.

The I/O blocks of CPLD 100 are configurable to support a variety of output standards. A sample of voltage levels associated with the output standards is set forth in Table 1 below.

TABLE 1

| Voltage Level (VCCIO) | Output Standard |
| --- | --- |
| 3.3 V | LVTTL |
| 2.5 V | LVCMOS2 |
| 1.8 V | X25TO18 |

The I/O blocks of CPLD 100 are grouped into physical output banks (POBs), wherein the I/O blocks within a POB are configurable to implement a selected voltage standard. For example, block 110 represents a POB that implements selected output voltage standards. It will be appreciated that POBs are independently configurable to different output standards. The invention described herein is directed to placing output signals with different voltage standards in function blocks.

The function blocks are coupled to switch matrix 106 via input and output signal lines. For example, function block 108 is coupled to switch matrix 106 via signal lines 116 and 118. Signal lines 116 are coupled to a plurality of output resources of switch matrix 106, and signal lines 118, representing a plurality of feedbacks, are coupled to a plurality of input resources of the switch matrix. Signal lines 118 are also directly coupled to selected ones of the I/O blocks 102. Since the FBs are directly connected to the I/O blocks, the FBs are fixedly associated with the POBs.

A generalized description of the task to be performed by the present invention involves placing a plurality of output signals in the plurality of function blocks.

Figure 2:
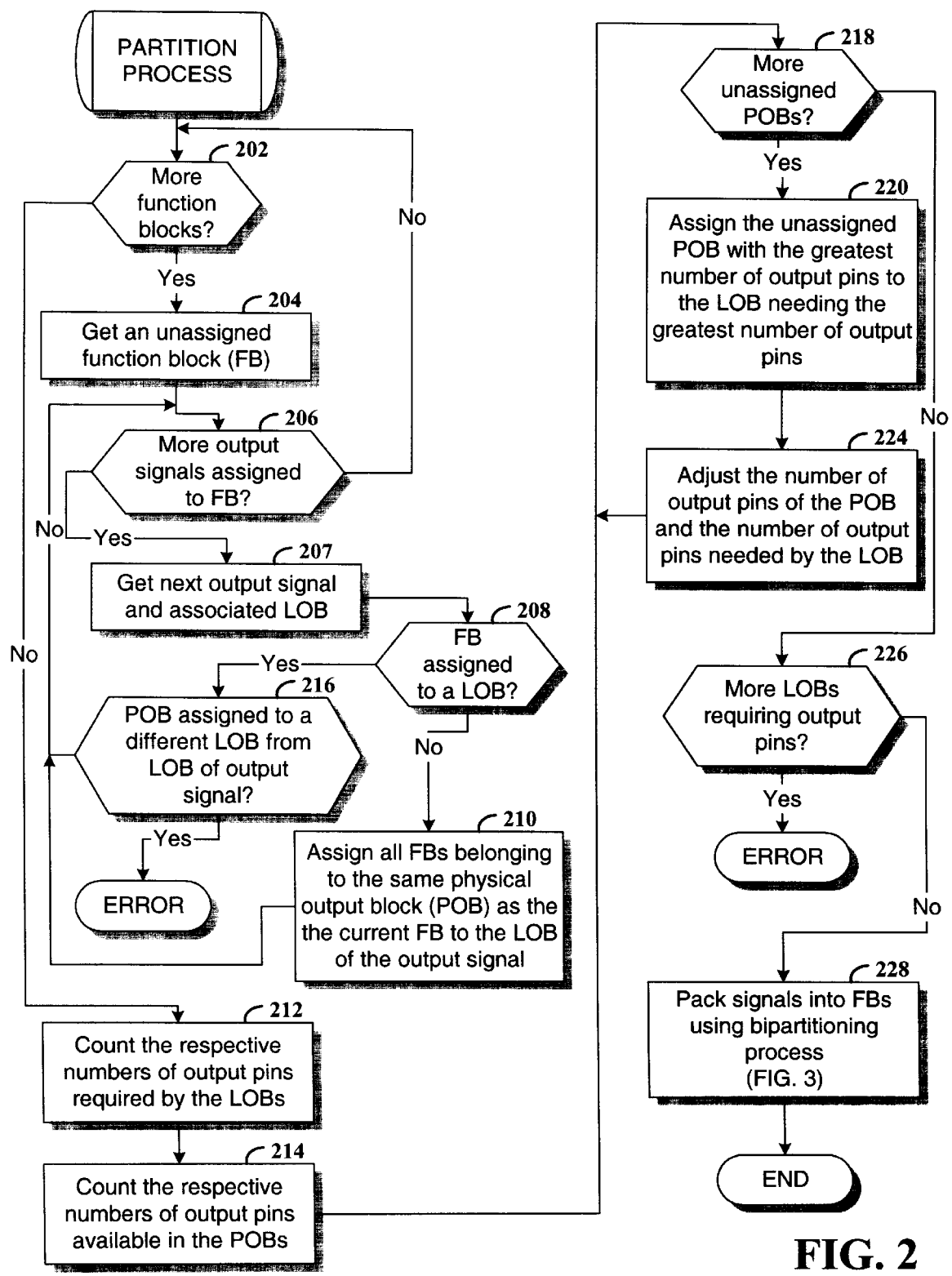
FIG. 2 is a flowchart of a process for partitioning output signals of a design amongst the function blocks (FBs) available in the device.

FIG. 2 is a flowchart of a process for partitioning output signals of a design amongst the function blocks (FBs) available in the device. The process begins by assigning the FBs to LOBs.

Decision step 202 directs the process to step 204 while there remain unprocessed FBs. Step 204 gets an unprocessed FB and directs the process to decision step 206, which tests whether there are any more unprocessed output signals assigned to the FB by the design. If not, control is returned to decision step 202 since the FB is available for assignment of output signals later in the process. If there are more unprocessed output signals, the process is directed to decision step 207, which gets the next unprocessed output signal and the associated LOB. Decision step 208 checks whether the FB is already assigned to an LOB.

If the FB is not yet assigned to an LOB, the process is directed to step 210. At step 210, all FBs that are in the same POB as the current FB (the FB in process as selected at step 204) are assigned to the LOB of the output signal as identified at step 207. The process then returns to decision step 206.

If an FB is already assigned to an LOB, decision step 208 directs the process to decision step 216 to check for an error. Decision step 216 tests whether the POB to which the FB belongs is already assigned to a different LOB from the LOB associated with the output signal. If so an error is reported and the process terminates. Otherwise, the process returns to decision step 206.

Once all the function blocks having signal assignments have been processed, decision step 202 directs the process to step 212. This next part of the process assigns POBs to LOBs based on output pin availability in the POBs and output pin requirements of the LOBs. At step 212, the numbers of output pins required by the LOBs are counted, and the numbers of output pins available in the POBs are counted at step 214.

Decision step 218 controls a process loop for assigning POBs to LOBs. The process is directed to step 220 as long as there remain POBs that are not yet assigned to any LOB. At step 220, the POB having the greatest number of available output pins is assigned to the LOB that has the greatest number of output signals requiring pin assignments. The process continues at step 224, where the number of available output pins of the just-assigned POB is adjusted as is the number of output pins required by the LOB to which the POB was assigned. Control is then returned to decision step 218 to check for more unassigned POBs.

When all the POBs have been assigned, decision step 218 directs the process to decision step 226. If there are LOBs needing more output pins after all the POBs have been assigned, an error is reported and the process terminated. Otherwise, the process is directed to step 228 to pack the signals into FBs using a bi-partitioning process.

At this juncture, all output signals have been assigned to an LOB; some output signals are placed on FBs and others are not; all FBs having assigned output signals (and FBs within the same POBs) are assigned to a LOB; and each LOB has a suitable number of POBs assigned. The pack signals process is described next.

Figure 3:
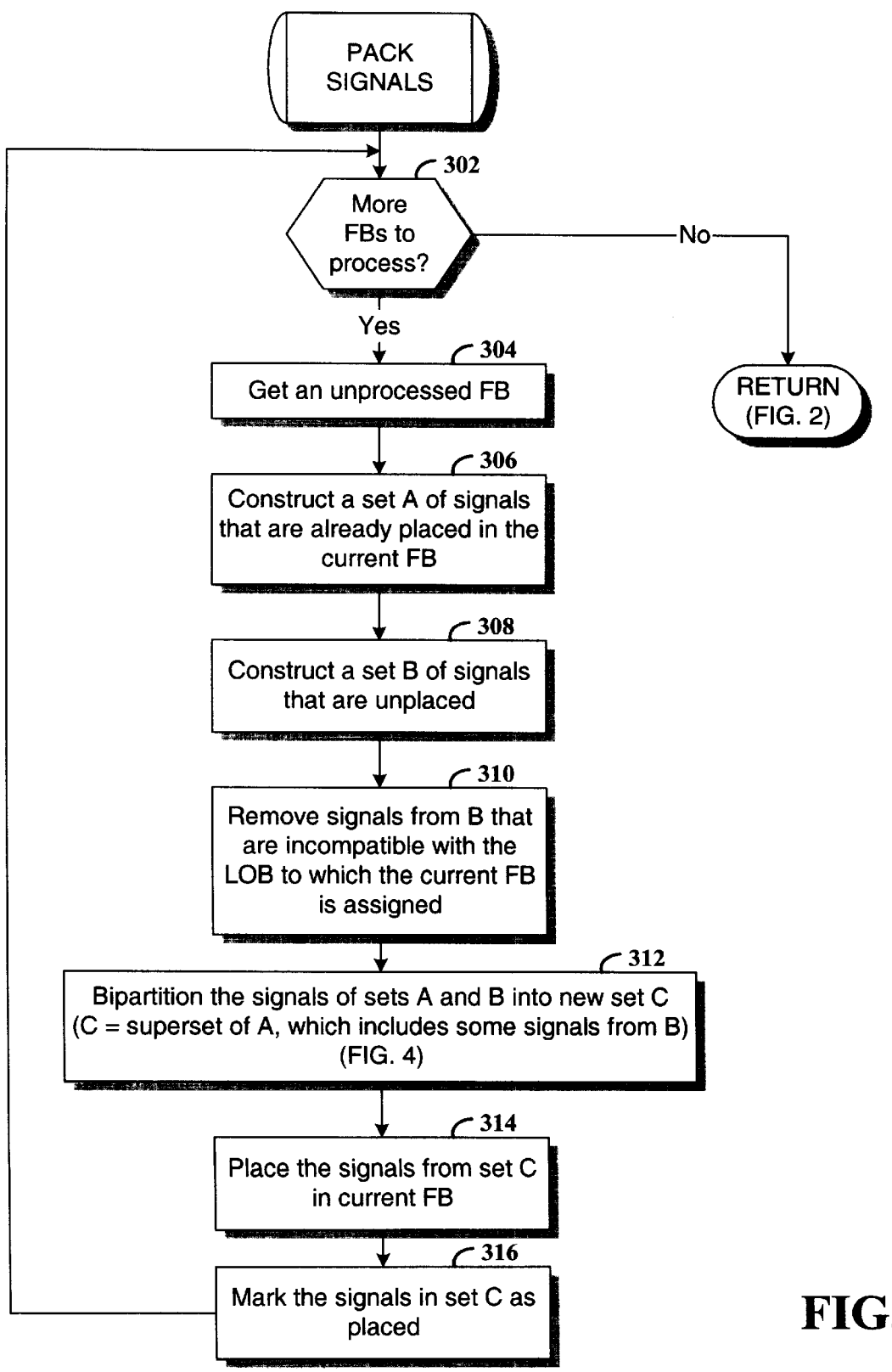
FIG. 3 is a flowchart of a process for assigning the unassigned signals to FBs.

FIG. 3 is a flowchart of a process for assigning the unassigned signals to FBs. The signals are processed by considering each of the FBs in combination with the unassigned signals. Decision step 302 directs the process to step 304 until all the FBs have been processed.

At step 304, an unprocessed FB is obtained, and step 306 constructs a set A containing the signals that are placed in the current FB. Step 308 constructs a second set, B, containing all the signals that are not yet placed. The signals include both output signals and signals in the design that do not require I/O resources ("buried nodes"). At step 310 the signals of set B that are incompatible with the LOB to which the current FB is assigned are removed from set B.

At step 312, a bi-partition process is performed on the signals in sets A and B. The bi-partition process (FIG. 4) constructs a combination of one or more signals of set B to be placed in the current FB. Thus, the bi-partition process returns a set C that is a superset of the signals of set A. At step 314, the signals from C are placed in the current FB and designated as placed in step 316. The process then returns to decision step 302 as described above.

Figure 4:
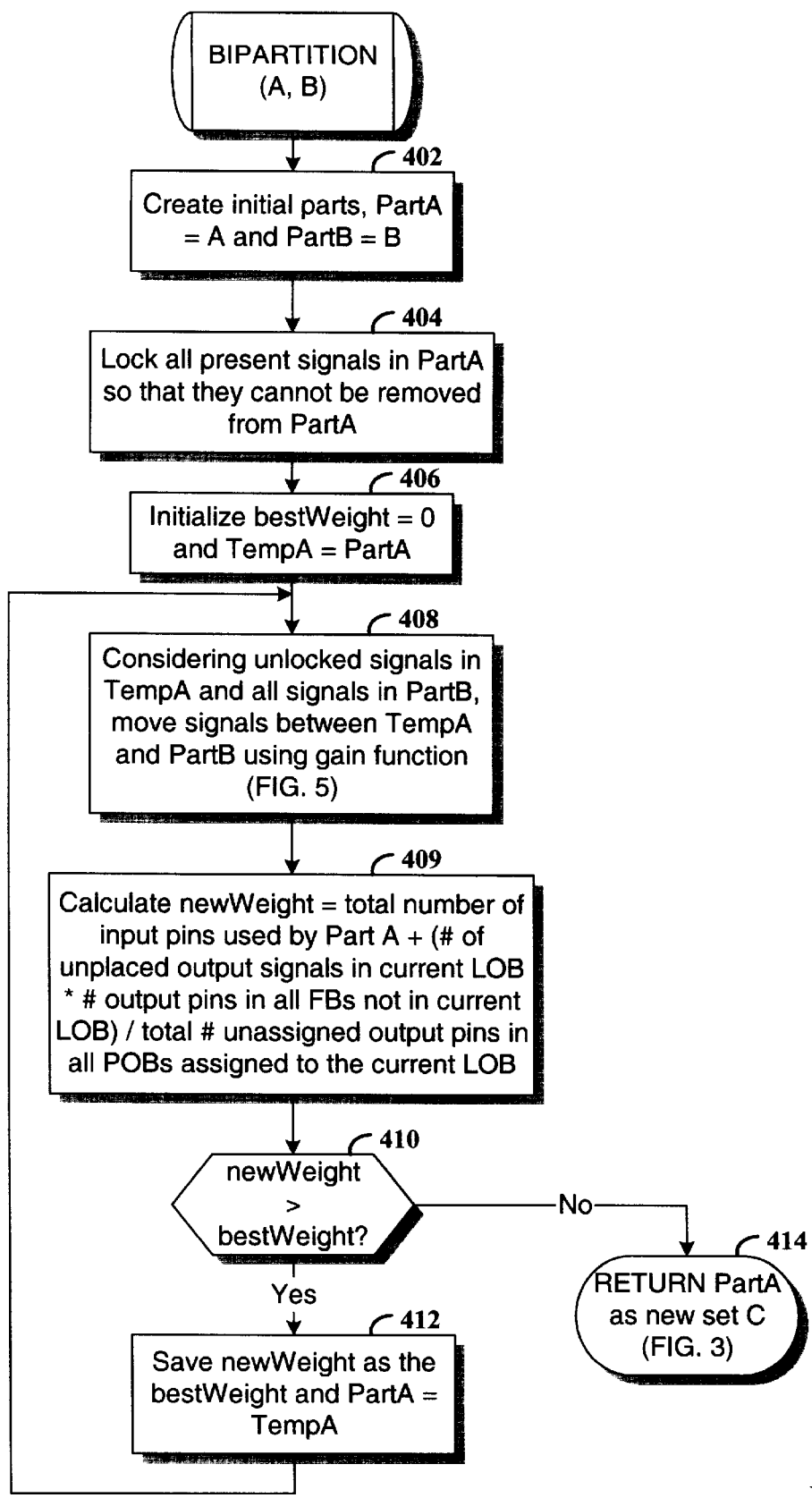
FIG. 4 is a process for bi-partitioning the signals between two input sets of signals.

FIG. 4 is a process for bi-partitioning the signals between two input sets of signals, A and B. At step 402, the initial parts, PartA and PartB are created from the input sets of signals. The signals in the initial PartA are locked at step 404. By locking the signals, they become ineligible for movement to PartB. At step 406, a bestWeight variable is initialized with the value 0, and a temporary variable, TempA is assigned the signals in PartA.

Figure 5:
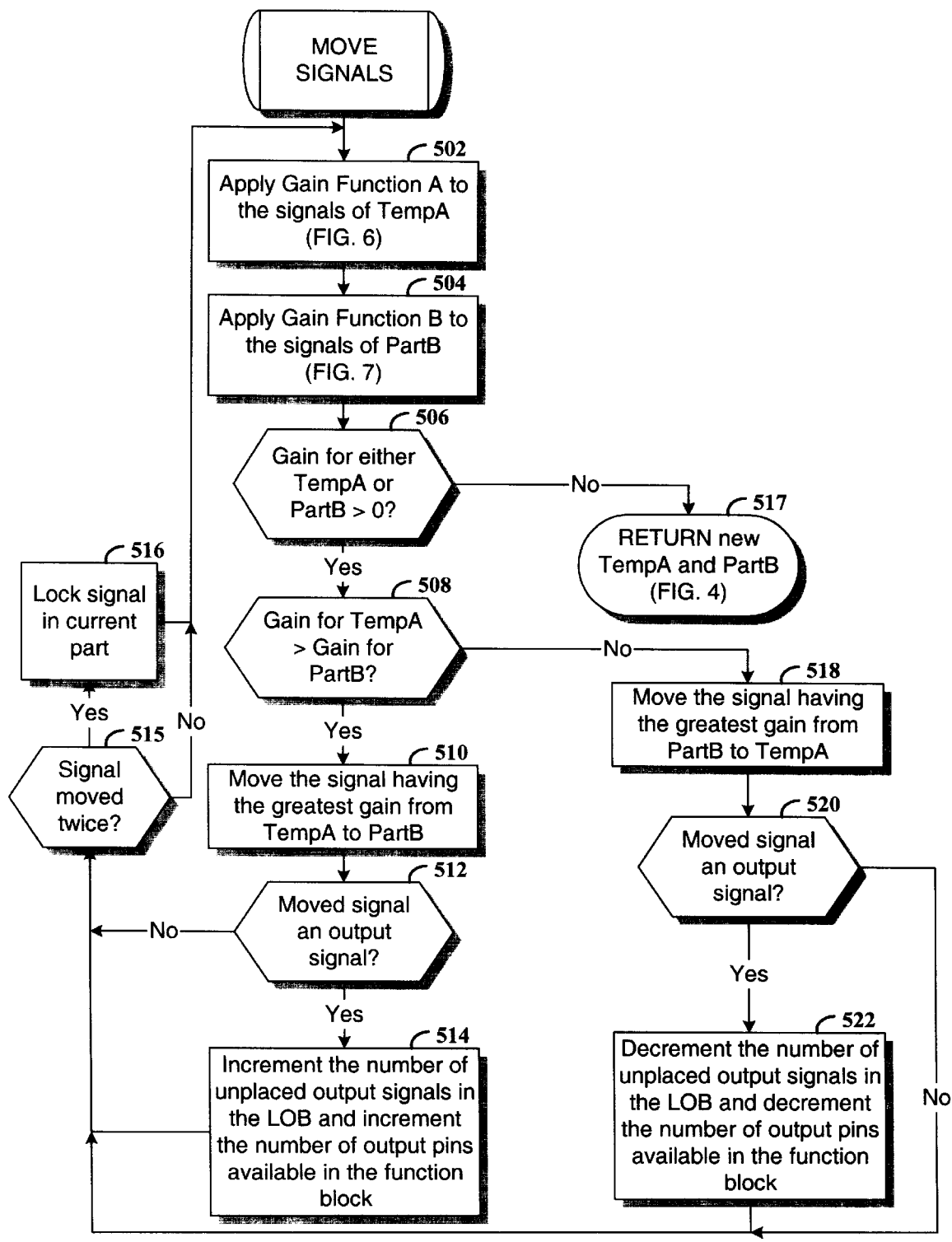
FIG. 5 is a flowchart of a process for moving signals between two parts.

At step 408, signals are moved between TempA and PartB using the move signals process of FIG. 5, which invokes the gain functions of FIGS. 6 and 7. Step 409 calculates a newWeight value based on the partitioning performed by the move signals process of step 408. The newWeight=total number of input pins used by PartA+(# of unplaced output signals in current LOB*# output pins in all FBs not in current LOB)/total # unassigned output pins in all POBs assigned to the current LOB. If the newWeight is greater than the bestWeight, decision step 410 directs the process to step 412 where the newWeight is saved as the bestWeight, and PartA is updated with the new TempA. The process is then returned to step 408.

If after an iteration of the move signals process at step 408, the newWeight is not greater than the bestWeight, the current PartA is returned as the new set C to the pack signals process of FIG. 3.

FIG. 5 is a flowchart of a process for moving signals between two parts. The first part, TempA, includes signals presently assigned to an FB, and the second part, PartB, includes unplaced signals. The process attempts to evenly place signals in the FBs of an LOB while ensuring that all the signals fit within the available FBs. The even placement of signals may leave pins available within the FBs, which provides flexibility in placing signals if a design change later becomes necessary.

At step 502 a gain function A is applied to TempA, and at step 504 a gain function B is applied to PartB. Each of the gain functions calculates gain values for the signals in the respective partitions and returns the maximum of the gain values. Each gain value is a function of the number of unplaced output signals in the current LOB, the number of output pins in all FBs that are not in the current LOB, and the total number of unassigned output pins in all POBs that are assigned to the current LOB. The gain value also accounts for the number of input signals that are common to the signal being processed and the signals in the other part.

Decision step 506 tests whether either of the gain values returned from the gain functions is greater than 0 (the initial gain values for TempA and PartB are 0). The process is directed to decision step 508 if either of the gain values is greater than 0. Otherwise, at step 517 the new TempA and PartB are returned to the process of FIG. 4.

Decision step 508 tests whether the gain value for TempA is greater than the gain value for PartB and if so directs the process to step 510. At step 510, the signal having the greatest gain value is moved from TempA to PartB. If the moved signal is an output signal, this increases the number of output pins available in the current FB, which is desirable from the perspective of placing a modified design at a later time. An objective of the gain function is to distribute placement of the output signals across the FBs when there are many more output pins than banked output signals. Similarly, if there are fewer output pins available for the output bank, the gain function results in placing more output signals in the current FB. If the moved signal is an output signal, decision step 512 directs the process to step 514. Since the process also places signals in the design that do not require I/O resources ("buried nodes"), the pin count and the count of unplaced output signals do not need to be adjusted when a signal other than an output signal is moved. Step 514 increments the count of unplaced output signals in the LOB and increments the count of the number of output pins available in the function block. The process is then directed to decision step 515.

Decision step 515 tests whether the moved signal has been moved twice. That is, after a signal is moved twice it is back in the same part as when the move signals process began. A twice-moved signal is disqualified from further gain calculations at step 516 by locking it in the corresponding part, and the process returns to step 502.

At decision step 508, if the gain value for TempA is less than or equal to the gain value for PartB, the process is directed to step 518. At step 518, the signal in Parts that has the greatest gain value is moved from PartB to TempA. If the moved signal is an output signal, decision step 520 directs the process to step 522. At step 522, the count of the number of unplaced output signals in the LOB is decremented, and the count of the number of output pins available in the FB is decremented. The process then returns to step 502 for another iteration.

FIG. 6 is a flowchart of a process for finding the maximum gain value for the signals in TempA, which contains signals assigned to a particular FB. The process generally entails calculating gain values for the signals in TempA and returning the greatest gain value and the signal identifier of the signal having the greatest gain value.

Decision step 602 controls the process loop and directs the process to step 604 while there remain unprocessed signals. At step 604, an unprocessed signal is obtained, and step 606 then calculates a first part of the gain value, I. Note that signals that were originally assigned to PartA and the signals that have been moved twice are not considered for gain calculation since they are locked to the part. This first part of the gain value is the number of input signals contributing to the signal of TempA that are also input signals to the signals in PartB.

At step 608, the first part of the gain value is combined with a second part of the gain value to obtain the final gain value for the signal. The final gain value, Gf, is $$G_f = I - G_o$$

where $$G_o = (S_u * O_f)/O_p$$

I is the first part of the gain value and $G_o$ is the second part of the gain value; $S_u$ is the number of unplaced output signals in the LOB of the current FB (current FB from FIG. 3); $O_f$ is the number of output pins in all the FBs that are not in the current LOB; and $O_p$ is the total number of unassigned output pins in all POBs that are assigned to the current LOB. It is generally desirable to place output signals that have common input signals in order to share FB input resources. Thus, the I value increases the gain value for a signal.

An objective of the gain function is to place all output signals belonging to a LOB in the resources available for that LOB, while spreading the output signals across as many FBs as possible in order to improve pin-locking. "Pin-locking" refers to adding or changing the logic in a design while maintaining the previous placement of output signals on output pins. It is easier to expand the logic associated with an output signal if there are resources available in the FB to which the output signal is assigned. It is more difficult to expand the logic if there are many output signals already placed on the FB.

The $S_u$ term decreases the gain of moving an output signal out of this FB if there are still many unplaced output signals in this LOB by increasing the second gain value $G_o$. The $O_f$ term increases the gain $G_o$ so that the resulting value of division by $O_p$ is greater than 1. Note that the $O_f$ term is the same for all gain values calculated for an FB. The $O_p$ term reduces the gain value $G_o$ where there are many other output pins available in FBs assigned to this FB. This improves the distribution of output signals across multiple FBs, but at the same time retains more output signals in the current FB if this number is high (LOB is large or not many output pins available in other FBs).

After step 608, the process returns to decision step 602 to compute the gain value for the next unprocessed signal.

When gain values have been calculated for all the signals in TempA, decision step 602 directs the process to step 610. At step 610, the maximum gain value and the identifier of the corresponding signal are returned to the process of FIG. 5. Note that the gain value 0 is returned if there are no signals to process, for example, if all the signals have been locked.

FIG. 7 is a flowchart of a process for finding the maximum gain value for the signals in PartB, which contains unplaced signals. The process generally entails calculating gain values for the signals in PartB and returning the greatest gain value and the signal identifier of the signal having the greatest gain value.

Decision step 702 controls the process loop and directs the process to step 704 while there remain unprocessed signals. At step 704, an unprocessed signal is obtained. Note that signals that have been moved twice are no longer considered for gain calculation by being locked. Decision step 706 tests whether moving the signal from PartB to TempA would violate resource limits. For example, if there are no more output pins available in the current FB and the current signal is an output signal, the process is directed to step 708 and a gain value of 0 is returned to the process of FIG. 5.

At step 710, a first part of gain value is calculated. This first part of the gain value is the number of input signals contributing to the signal of PartB that are also input signals to the signals in TempA.

At step 712, the first part of the gain value is combined with a second part of the gain value to obtain the final gain value for the signal. The final gain value, Gf, is $$G_f = I + G_o$$

$$G_o = (S_u * O_p)/O_p$$

where I, $G_o$, $S_u$, $O_p$, and $O_p$ are as described above in the process of FIG. 6. Note that here $G_o$ is added to the gain I while in FIG. 6 it was subtracted. This increases chance of placing output signals in current FB if $G_o$ is large by retaining output signals already placed there, or by moving output signals into the FB from the set of unplaced signals. A complementary argument can be used when $G_o$ is small.

When gain values have been calculated for all the signals in PartB, decision step 702 directs the process to step 714. At step 714, the maximum gain value and the identifier of the corresponding signal are returned to the process of FIG. 5. Note that the gain value 0 is returned if there are no signals to process, for example, if all the signals have been locked.

Figure 8A:
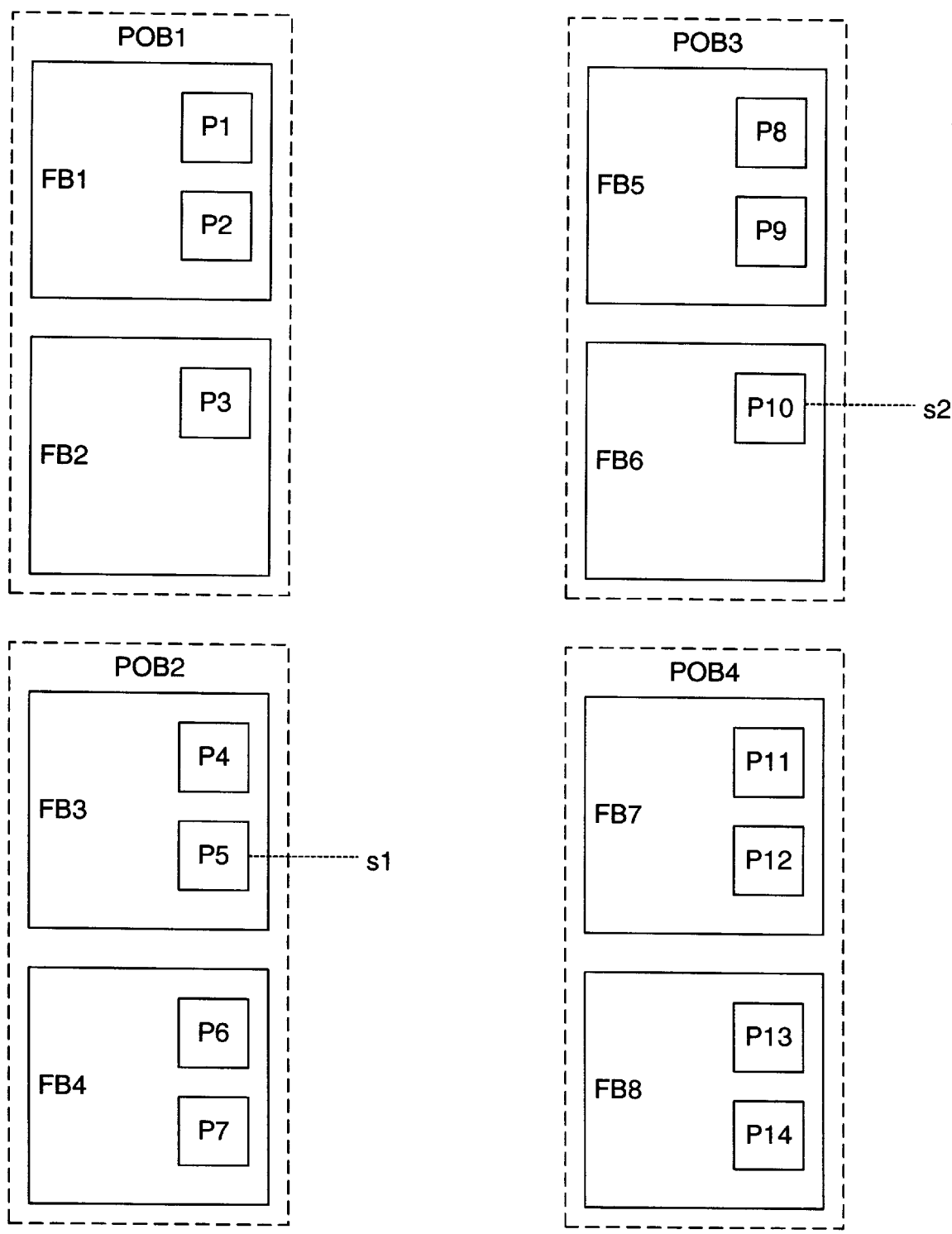
FIG. 8A is a block diagram that includes an example set of FBs.

An example is provided to assist in the explanation of the placement process. FIG. 8A is a block diagram that includes an example set of FBs (FB1–FB8), where FB1 and FB2 belong to POB1, FB3 and FB4 belong to POB2, FB5 and FB6 belong to POB3, and FB7 and FB8 belong to POB4. FB1 has output pins P1 and P2, FB2 has output pin P3, FB3 has output pins P4 and P5, FB4 has output pins P6 and P7, etc. It will be appreciated that FBs in some CPLD architectures have different numbers of output pins. The example includes 8 signals, s1–s8, that are to be placed in the FBs. Signals s1 and s2 have different voltage levels, and the design requires placement of s1 on P5 and s2 on P10. Signal s3 has the same voltage level as s1, and signals s4–s8 have the same voltage level as s2. Thus, signals s1 and s3 are assigned to LOB1, and signals s2 and s4–s8 are assigned to LOB2. After all the function blocks have been processed by step 202 of FIG. 2, POB2 is assigned to LOB1, and POB3 is assigned to LOB2. Table 2 below illustrates the signal/LOB/POB relationships at this juncture.

TABLE 2

| Signal | LOB | POB |
| --- | --- | --- |
| s1 | LOB1 | POB2 |
| s2 | LOB2 | POB3 |
| s3 | LOB1 | — |
| s4 | LOB2 | — |

TABLE 2-continued

| Signal | LOB | POB |
| --- | --- | --- |
| s5 | LOB2 | — |
| s6 | LOB2 | — |
| s7 | LOB2 | — |
| s8 | LOB2 | — |

In the example, LOB1 requires 2 output pins and since LOB1 has POB2 assigned, there are 4 output pins available. Thus, the remaining number of output pins required by LOB1 is equal to the number of output pins required minus the number of output pins available in the assigned POB (2−4=−2). LOB2 requires 3 pins (6 pins required−3 pins in POB3=3). POB1 has 3 pins available (P1−P3), and POB4 has 4 pins available (P11−PF14).

At step 220 of FIG. 2, POB4 has the greatest number of output pins, and LOB2 has the greatest number of output pins required. Thus, POB4 is assigned to LOB2, and the output pin counts are adjusted. The output pin requirement of LOB1 remains at −2, and the output pin requirement of LOB2 is −1 (6 output pins required −7 output pins available in POB3 and POB4). Since POB2, POB3, and POB4 are assigned to LOBs, they have no output pins available. On the next iteration of the loop, POB1 is unassigned and has 3 output pins available. Since LOB2 has the greatest output pin requirement (−1), and POB1 has the greatest number of output pins available, POB1 is assigned to LOB2. Table 3 below illustrates the assignment of POBs/FBs to the LOBs.

TABLE 3

| LOB | POB/FB |
| --- | --- |
| LOB1 | POB2 /FB3 |
|  | POB2 /FB4 |
| LOB2 | POB1/FB1 |
|  | POB1 /FB2 |
|  | POB3 /FB5 |
|  | POB3 /FB6 |
|  | POB4 /FB7 |
|  | POB4 /FB8 |

In the example and prior to step 228 of FIG. 2, LOB1 has FB3 and FB4 assigned (POB2), and LOB2 has assigned FB1 and FB2 (POB1), FB5 and FB6 (POB3), and FB7 and FB8 (POB4).

The example continues with the processing performed by the pack signals process of FIG. 3. Considering first FB1, set A is empty since there are no signals placed in FB1. Set B includes signals s4–s8 since FB1 is assigned to LOB2, and LOB2 has signal s2 already placed. The pack signals process of FIG. 3 invokes the bi-partition process of FIG. 4, which invokes the move signals process of FIG. 5. The move signals process moves signals between the sets A and B using the gain functions of FIGS. 6 and 7.

In the first iteration of the move signals process, the gain value for set A is 0 since set A has no signals assigned. When step 710 is applied to each of the signals in set B, the number of common input signals is zero since set A is presently empty. The last term of the gain calculations for the output signals is the same for all output signals. The gain values for all the signals in set B=0+(5*4)/9=2 (see step 712), where number of unplaced output signals in current LOB=5 (s4–s8), # output pins in FBs not belonging to this LOB=4 (2(FB3)+2(FB4)), and number of available pins in all FBs assigned to this LOB=9(2(FB1)+1(FB2)+2(FB5)+0(FB6)+2(FB7)+2(FB8)). Signal s4 is moved from set B to set A since all the signals in set B have the same gain value and signal s4 is the first signal processed. Thus, at this juncture, set A has signal s4, and set B has signals s5–s8. The number of unplaced output signals in the LOB and the number of output pins available in the function block (FB1) are decremented (step 522), and the gain functions are reapplied to sets A and B (502, 504).

Assuming that signals s4 and s5 have one common input signal, the gain value for signal s4 (now in set A)=1−(4*4)/8=−1. Since set A has only one signal, −1 is maximum gain value for the set. The gain value for signal s5 and the maximum for set B=1+(4*4)/8=3. Since the gain value for set B is greater than the gain value for set A, signal s5 is moved to set A. The number of unplaced output signals in the LOB and the number of output pins available in the function block (FB1) are decremented (step 522), and the gain functions are again applied to sets A and B (502, 504).

The maximum gain value of set B is 0 since adding another output signal to set A would violate resource limits of set A (step 706). That is, FB1 has two output pins, and there are two output signals assigned to FB1 at this intermediate stage. Assuming that signal s5 has 3 input signals in common with signals s6, s7, and s8 of set B and signal s4 has 0, the maximum gain for set A=3−(3*4)/7=2. Since the gain value for set A is greater than the gain value for set B, signal s5 is moved back to set B and locked. The number of unplaced output signals and the number of available output pins are incremented (step 514).

In the next iteration, the maximum gain value for set A=1−(4*4)/8=−1. The maximum gain value for set B=0+(4*4)/8=2 for signal s6. Signal s6 is moved to set A since the maximum gain value for set B is greater than the maximum gain value for set A, and the number unplaced output signals and the number of available output pins are decremented. Set A has signals s4 and s6, and set B has signals s5, s7, and s8.

In the next iteration, the maximum gain value for set A=2−(3*4)/7=1 for signal s6, assuming that signal s6 has 2 input signals in common with the signals of set B. The maximum gain value for set B=0 since FB1 has no more output pins available. Thus, signal s6 is moved back to set B and locked.

Assuming that signals s7 and s8 are individually processed and moved from set B to set A and then moved back to set B as described above (e.g., as for signal s6), the next iteration calculates the maximum gain values as follows. For set A, the maximum gain value=0−(4*4)/8=−2, since signal s4 is present in set A and is still eligible to be moved back to set B. The maximum gain value for set B=0 since all the signals in set B have been processed and locked. Since neither of the maximum gain values for sets A and B are greater than 0, the processing of FB1 is complete. At this juncture, signal s4 is placed on FB1={s4}, and the unplaced signals are {s5, s6, s7, s8}.

FB2 is next selected for processing (step 304). Set A is initially empty since there are no signals placed in FB2. The unplaced signals of LOB2 in set B={s5, s6, s7, s8}. The process proceeds as described above. In continuing the example, it is assumed that when processing is complete FB2={s7}, and the unplaced signals are {s5, s6, s8}.

FB3 is the next FB processed by the pack signals process. FB3 is assigned to LOB1, and signal s1 is by design assigned to pin P5. LOB1 includes signals s1 and s3. Thus, initially set A {s1}, and set B {s3}. The maximum gain value for set A=0 since signal s1 is assigned by the design to pin P5 of FB3 and therefore is ineligible to be moved to set B. Assuming that s3 has 1 input signal in common with signal s1, the gain value=1+(1*10)/3=4. Thus, signal s3 is moved to set A. The maximum gain value for set A=0−(0*10)/2=0, and the maximum gain value for set B=0. Since neither gain value is greater than 0, the processing of FB3 is complete. FB3={s1, s3}, and there are no additional unplaced signals in LOB1.

In next processing FB4, there are no additional unplaced output signals in LOB1. Thus, no output signals are placed in FB4.

Figure 8B:
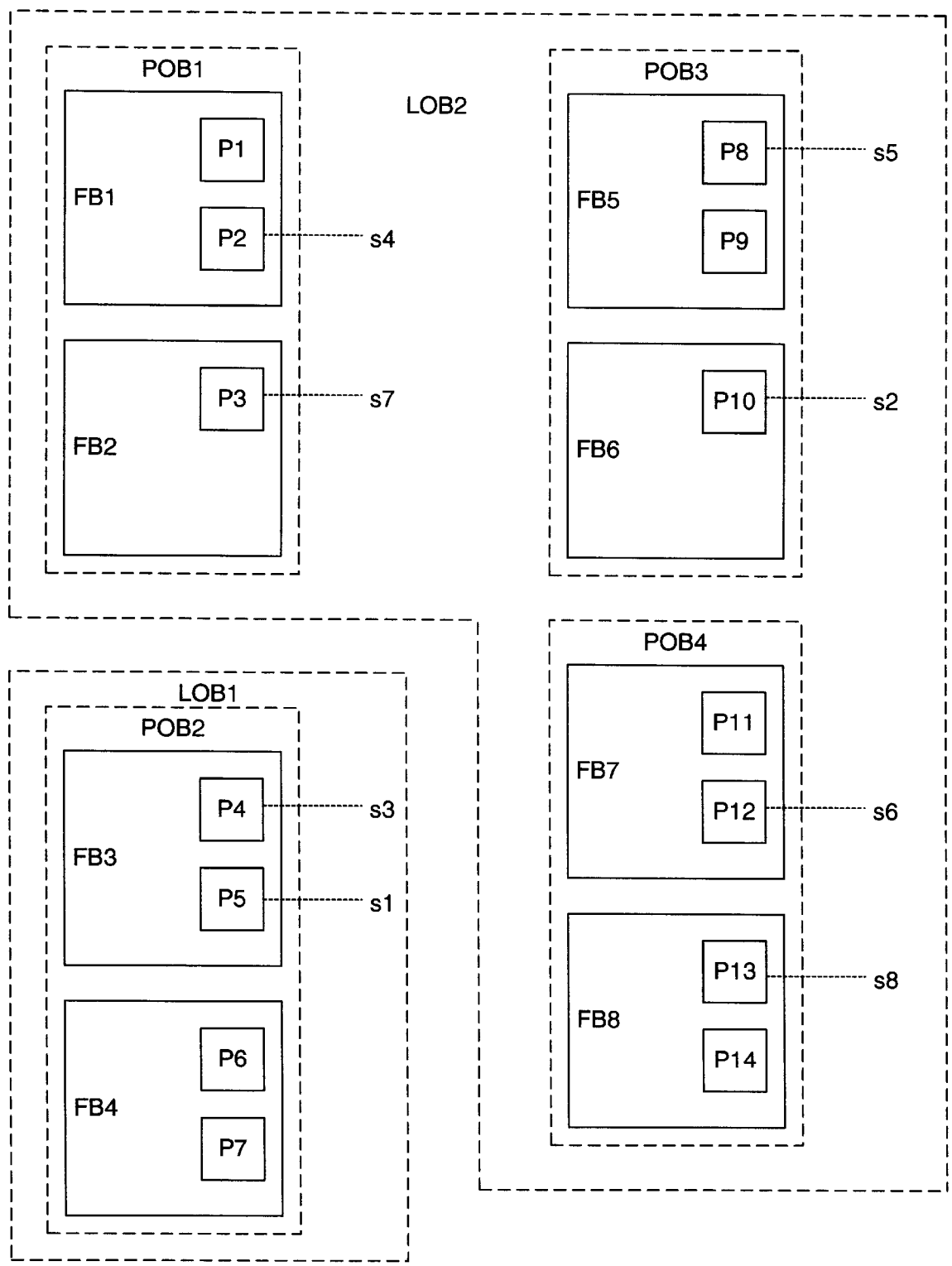
FIG. 8B illustrates an example placement of signals on the FBs of FIG. 8A.

The processing proceeds for each of FB5, FB6, FB7, and FB8 as described above. At the end of the process, the remaining signals of LOB2 will have been placed on these FBs according to the gain functions described above. For example, FB5={s5}; FB6={s2}; FB7={s6}; and FB8={s8}. FIG. 8B illustrates the placement of signals for this example.

The present invention for placing output signals of different voltage standards is believed to be applicable to a variety of programmable logic devices. While the invention has been described in terms of a particular CPLD, it will be recognized that the invention is not limited thereto. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for placing output signals in output pins of function blocks of a programmable logic device, each function block including one or more output pins and the output signals including signals of one or more voltage levels, comprising:

grouping the output signals into logical output banks (LOBs), the output signals in each LOB having a common voltage level;

associating one or more function blocks with each LOB; and for each function block and a current LOB with which the function block is associated, selecting one or more unplaced signals for placement in the function block as a function of a number of unplaced output signals in the current LOB, a number of output pins in function blocks associated with LOBs other than the current LOB, and a number of output pins in all function blocks that are associated with the current LOB and that have no assigned output signals.

2. The method of claim 1, wherein the function for selecting signals for placement is further a function of a number of input signals that are common to the output signals in the LOB.

3. The method of claim 2, further comprising: for each function block, forming a first set of output signals placed on the function block;

forming a second set of unplaced output signals belonging to the current LOB;

for each signal in the first set, computing a gain value as a first function of a number of unplaced output signals in the current LOB, a number of output pins in function blocks associated with LOBs other than the current LOB, a number of output pins in all function blocks that are associated with the current LOB and that have no assigned output signals, and a number of input signals that are common to the output signals in the LOB;

for each signal in the second set, computing a gain value as a second function of a number of unplaced output signals in the current LOB, a number of output pins in function blocks associated with LOBs other than the current LOB, a number of output pins in all function blocks that are associated with the current LOB and that have no assigned output signals, and a number of input signals that are common to the output signals in the LOB;

if a maximum of the gain values from the first function is greater than a maximum of the gain values from the second function, moving the output signal having the maximum gain value from the first set to the second set; and if a maximum of the gain values from the second function is greater than a maximum of the gain values from the first function, moving the output signal having the maximum gain value from the second set to the first set.

4. The method of claim 3, wherein
the first gain function, $G_1 = I_1 - (S_u * O_f)/O_p$, where
$G_1$ is the gain value of a signal in the first set;
$I_1$ is the number of input signals that are common between the output signal in the first set and the output signals in the second set;
$S_u$ is number of unplaced output signals in the current LOB;
$O_f$ is the number of output pins in function blocks associated with LOBs other than the current LOB; and
$O_p$ is the number of output pins in all function blocks that are associated with the current LOB and that have no assigned output signals; and
the second gain function, $G_2 = I_2 + (S_u * O_f)/O_p$, where
$G_2$ is the gain value of a signal in the second set; and
$I_2$ is the number of input signals that are common between the output signal in the second set and the output signals in the first set.

5. The method of claim 1, wherein for a circuit design having selected output signals assigned to selected output pins of the function blocks, and each function block being part of a physical output bank in which output pins have a common voltage level, the method further comprising:
counting numbers of available output pins that are unassigned to output signals in each physical output bank;
counting numbers of the output signals in the logical output banks; and
assigning the physical output banks to the logical output banks as a function of the numbers of available output pins and the numbers of output signals in the logical output banks.

6. The method of claim 5, wherein for a circuit design having selected output signals assigned to selected output pins of the function blocks, and each function block being part of a physical output bank in which output pins have a common voltage level, the method further comprising:
for each function block having one of more assigned output signals, associating the function block and other function blocks that are common to a physical output bank with an LOB into which the one or more assigned output signals are grouped.

7. The method of claim 5, wherein the function for assigning the physical output banks to the logical output banks assigns the physical output bank having a greatest number of available output pins to a logical output bank having a greatest number of output signals.

8. The method of claim 7, wherein for a circuit design having selected output signals assigned to selected output pins of the function blocks, and each function block being part of a physical output bank in which output pins have a common voltage level, the method further comprising:
for each function block having one of more assigned output signals, associating the function block and other function blocks that are common to a physical output bank with an LOB into which the one or more assigned output signals are grouped.

9. The method of claim 5, wherein the function for selecting signals for placement is further a function of a number of input signals that are common to the output signals in the LOB.

10. The method of claim 9, further comprising:
for each function block,
forming a first set of output signals placed on the function block;
forming a second set of unplaced output signals belonging to the current LOB;
for each signal in the first set, computing a gain value as a first function of a number of unplaced output signals in the current LOB, a number of output pins in function blocks associated with LOBs other than the current LOB, a number of output pins in all function blocks that are associated with the current LOB and that have no assigned output signals, and a number of input signals that are common to the output signals in the LOB;
for each signal in the second set, computing a gain value as a second function of a number of unplaced output signals in the current LOB, a number of output pins in function blocks associated with LOBs other than the current LOB, a number of output pins in all function blocks that are associated with the current LOB and that have no assigned output signals, and a number of input signals that are common to the output signals in the LOB;
if a maximum of the gain values from the first function is greater than a maximum of the gain values from the second function, moving the output signal having the maximum gain value from the first set to the second set; and
if a maximum of the gain values from the second function is greater than a maximum of the gain values from the first function, moving the output signal having the maximum gain value from the second set to the first set.

11. The method of claim 10, wherein
the first gain function, $G_1 = I_1 - (S_u * O_f)/O_p$, where
$G_1$ is the gain value of a signal in the first set;
$I_1$ is the number of input signals that are common between the output signal in the first set and the output signals in the second set;
$S_u$ is number of unplaced output signals in the current LOB;
$O_f$ is the number of output pins in function blocks associated with LOBs other than the current LOB; and
$O_p$ is the number of output pins in all function blocks that are associated with the current LOB and that have no assigned output signals; and
the second gain function, $G_2 = I_2 + (S_u * O_f)/O_p$, where
$G_2$ is the gain value of a signal in the second set; and
$I_2$ is the number of input signals that are common between the output signal in the second set and the output signals in the first set.

12. The method of claim 1, wherein for a circuit design having selected output signals assigned to selected output pins of the function blocks, and each function block being part of a physical output bank in which output pins have a common voltage level, the method further comprising:

for each function block having one of more assigned output signals, associating the function block and other function blocks that are common to a physical output bank with an LOB into which the one or more assigned output signals are grouped.

13. The method of claim 12, wherein the function for selecting signals for placement is further a function of a number of input signals that are common to the output signals in the LOB.

14. The method of claim 13, further comprising:

for each function block,
- forming a first set of output signals placed on the function block;
- forming a second set of unplaced output signals belonging to the current LOB;
- for each signal in the first set, computing a gain value as a first function of a number of unplaced output signals in the current LOB, a number of output pins in function blocks associated with LOBs other than the current LOB, a number of output pins in all function blocks that are associated with the current LOB and that have no assigned output signals, and a number of input signals that are common to the output signals in the LOB;
- for each signal in the second set, computing a gain value as a second function of a number of unplaced output signals in the current LOB, a number of output pins in function blocks associated with LOBs other than the current LOB, a number of output pins in all function blocks that are associated with the current LOB and that have no assigned output signals, and a number of input signals that are common to the output signals in the LOB;
- if a maximum of the gain values from the first function is greater than a maximum of the gain values from the second function, moving the output signal having the maximum gain value from the first set to the second set; and
- if a maximum of the gain values from the second function is greater than a maximum of the gain values from the first function, moving the output signal having the maximum gain value from the second set to the first set.

15. The method of claim 14, wherein
the first gain function, $G_1 = I_1 - (S_u * O_f)/O_p$, where
- $G_1$ is the gain value of a signal in the first set;
- $I_1$ is the number of input signals that are common between the output signal in the first set and the output signals in the second set;
- $S_u$ is the number of unplaced output signals in the current LOB;
- $O_f$ is the number of output pins in function blocks associated with LOBs other than the current LOB; and
- $O_p$ is the number of output pins in all function blocks that are associated with the current LOB and that have no assigned output signals; and the second gain function, $G_2 = I_2 + (S_u * O_f)/O_p$, where
- $G_2$ is the gain value of a signal in the second set; and
- $I_2$ is the number of input signals that are common between the output signal in the second set and the output signals in the first set.

16. An apparatus for placing output signals in output pins of function blocks of a programmable logic device, each function block including one or more output pins and the output signals including signals of one or more voltage levels, comprising:

means for organizing the output signals into logical output banks (LOBs), the output signals in each LOB having a common voltage level;

means for associating one or more function blocks with each LOB;

means for selecting, for each function block and a current LOB with which the function block is associated, one or more unplaced signals for placement in the function block as a function of a number of unplaced output signals in the current LOB, a number of output pins in function blocks associated with LOBs other than the current LOB, and a number of output pins in all function blocks that are associated with the current LOB and that have no assigned output signals.

* * * * *